(12) United States Patent
Shi et al.

(10) Patent No.: US 12,238,501 B2
(45) Date of Patent: Feb. 25, 2025

(54) SPEAKER UNIT

(71) Applicant: AAC Microtech (Changzhou) Co., Ltd., Changzhou (CN)

(72) Inventors: Yang Shi, Shenzhen (CN); Jiasheng Zhou, Shenzhen (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 190 days.

(21) Appl. No.: 18/095,002

(22) Filed: Jan. 10, 2023

(65) Prior Publication Data
US 2024/0007797 A1 Jan. 4, 2024

Related U.S. Application Data

(63) Continuation of application No. PCT/CN2022/114908, filed on Aug. 25, 2022.

(30) Foreign Application Priority Data

Jul. 1, 2022 (CN) .......................... 202221693068.9

(51) Int. Cl.
*H04R 9/06* (2006.01)
*H04R 7/04* (2006.01)
*H04R 9/02* (2006.01)
*H04R 9/04* (2006.01)
*H05K 1/18* (2006.01)

(52) U.S. Cl.
CPC ................. *H04R 9/06* (2013.01); *H04R 7/04* (2013.01); *H04R 9/025* (2013.01); *H04R 9/046* (2013.01); *H05K 1/189* (2013.01)

(58) Field of Classification Search
CPC . H04R 9/06; H04R 7/04; H04R 9/025; H04R 9/046; H05K 1/189
See application file for complete search history.

(56) References Cited

U.S. PATENT DOCUMENTS

2020/0053470 A1* 2/2020 Gu ...................... H04R 1/2811

* cited by examiner

*Primary Examiner* — Sunita Joshi
(74) *Attorney, Agent, or Firm* — W&G Law Group

(57) ABSTRACT

The present disclosure provides a speaker unit, which includes a frame, and a vibration system and a magnetic circuit system fixed on the frame. The vibration system includes a diaphragm and a voice coil that drives the diaphragm to vibrate and sound. The speaker unit further includes a magnetic front cover fixed on the frame for improving the BL value of the voice coil. The speaker unit of the present disclosure improves the BL value of the voice coil.

7 Claims, 3 Drawing Sheets

SPEAKER UNIT

FIELD OF THE PRESENT DISCLOSURE

The present disclosure relates to the field of electro-acoustic transducers, and in particular relates to speaker unit.

DESCRIPTION OF RELATED ART

The speaker unit usually includes a frame, a vibration system and a magnetic circuit system fixed on the frame, and a front cover which is fixed on the frame for protecting the vibration system. Wherein, the vibration system includes a diaphragm and a voice coil that drives the diaphragm to vibrate and sound. The front cover is usually made of non-magnetic materials such as stainless steel, copper, and plastic.

An important performance indicator of the speaker unit is the BL value of the voice coil (that is, the magnetic force value, which is the product of the magnetic flux density B and the length L of the voice coil wire). The higher the BL value of the voice coil, the greater the displacement of the lower diaphragm at the same voltage, and the higher the sound pressure level and sensitivity of the speaker unit. In order to obtain high sound pressure level and sensitivity of the speaker unit, how to improve the BL value of the voice coil has become the focus of research in the industry. At present, the common practice in the industry is to improve the magnetic circuit system, such as selecting high-performance magnets and high-permeability materials. However, the choice of high-performance magnets and high-permeability materials brings significant material cost problems, which greatly reduces the market competitiveness of products. Another example is designing a magnetic circuit system with a special structure, which often makes the structure of the magnetic circuit system very complicated, which is not conducive to production.

Therefore, it is necessary to provide a new speaker unit to solve the above technical problems.

SUMMARY OF THE PRESENT DISCLOSURE

The present disclosure is to overcome the above-mentioned technical problems and to provide a speaker unit that improves the BL value of the voice coil.

Accordingly, the present disclosure provides a speaker unit including a frame, a vibration system fixed on the frame and having a diaphragm and a voice coil for driving the diaphragm for generating sound, a magnetic circuit system fixed on the frame, and a magnetic front cover fixed on the frame for increasing a BL value of the voice coil.

Further, the magnetic circuit system includes a bottom plate, a main magnet fixed on the bottom plate, an auxiliary magnet fixed on the bottom plate and keeping a distance from the main magnet, a main pole plate attached to the main magnet and an auxiliary pole plate attached to the auxiliary magnet; the auxiliary pole plate includes a first flipped edge that is bent toward the bottom plate and is embedded in the frame.

Further, the frame includes a first side wall located at four corners and a second side wall located between two adjacent first side walls; the bottom plate includes a second flipped edge that is bent in a direction close to the diaphragm; the second flipped edge is inserted between the first side wall and the second side wall adjacent to the first side wall.

Further, the vibration system further includes an elastic support element arranged spaced apart from the diaphragm; the external fixed part of the elastic support element is fixed on the frame, and the internal fixed part of the elastic support element is fixed on the voice coil.

Further, the elastic support element includes a flexible circuit board fixed with the voice coil and an auxiliary diaphragm fixed on the bottom surface of the flexible circuit board away from the diaphragm; the bottom plate includes a through hole corresponding to the position of the auxiliary diaphragm, and a damping net cloth formed on the bottom surface of the bottom plate away from the auxiliary diaphragm for covering the through hole.

Further, the magnetic front cover is a soft magnetic front cover or a hard magnetic front cover.

Further, the magnetic front cover is fixed to the frame by gluing or welding.

Further, the magnetic front cover extends at least partially above the diaphragm.

The speaker unit of the present disclosure adopts a magnetic front cover, and the magnetic front cover optimizes the distribution of the magnetic field lines of the magnetic circuit system. When the voice coil works, more magnetic field lines can pass through the voice coil, thereby increasing the BL value of the voice coil. The magnetic front cover protects the vibration system with the conventional front cover and at the same time improves the BL value of the voice coil, killing two birds with one stone and easy to implement. In addition, it is generally believed that the front cover is only used to protect the vibration system, the technical means of improving the BL value of the voice coil through the magnetic front cover is not thought or expected by those skilled in the art, and achieves an unexpected effect.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

The present disclosure will hereinafter be described in detail with reference to an exemplary embodiment. To make the technical problems to be solved, technical solutions and beneficial effects of the present disclosure more apparent, the present disclosure is described in further detail together with the figures and the embodiment. It should be understood the specific embodiment described hereby is only to explain the disclosure, not intended to limit the disclosure.

Figure 1:
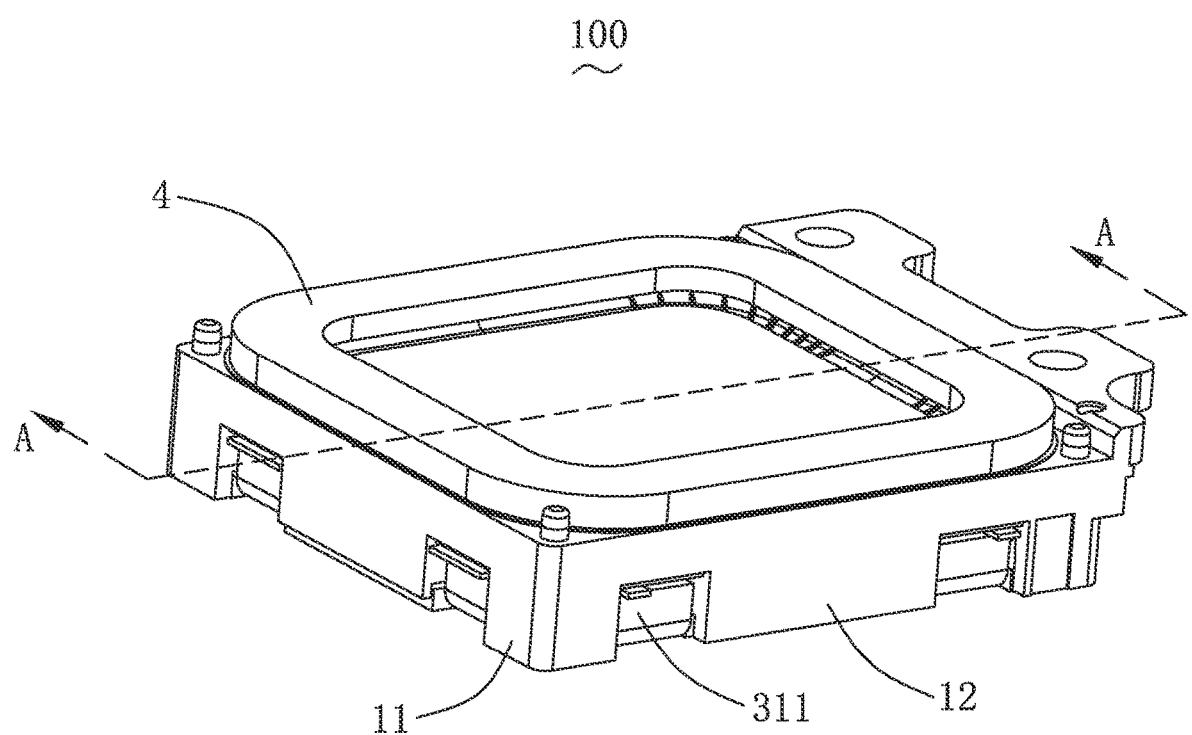
FIG. 1 is an isometric view of a speaker unit of an embodiment of the present disclosure.
Figure 2:
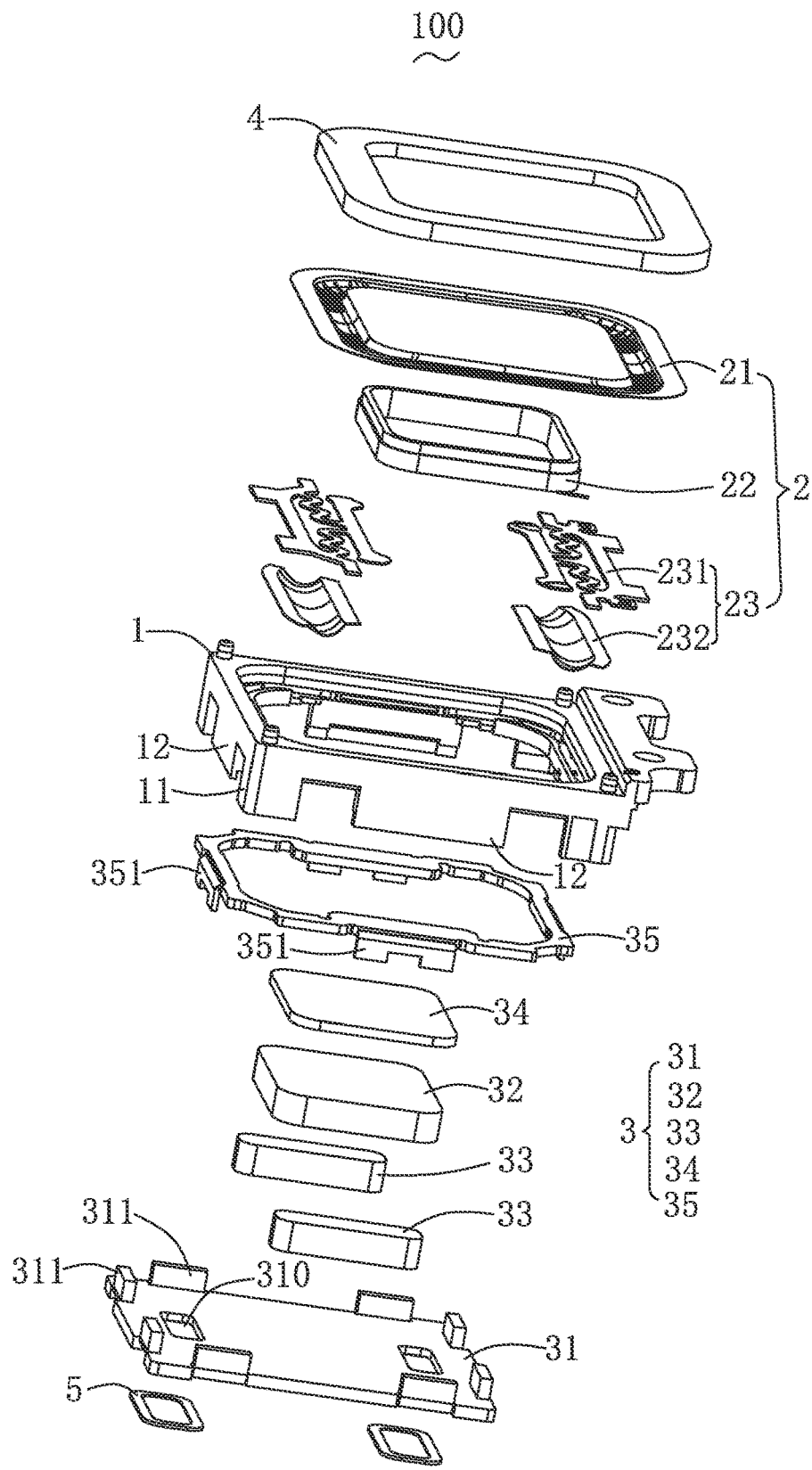
FIG. 2 is an isometric and exploded view of the speaker unit in FIG. 1.
Figure 3:
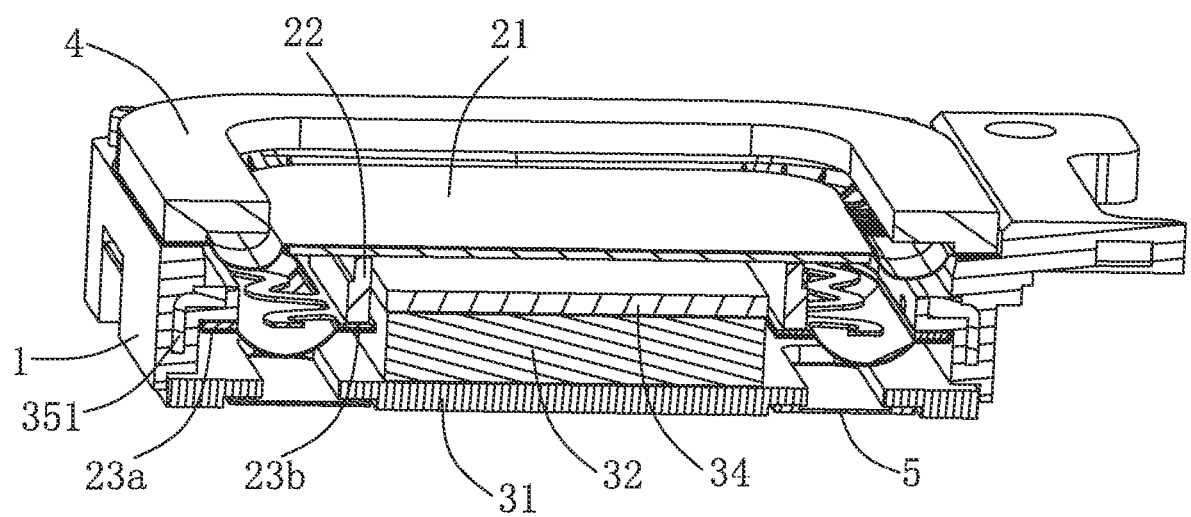
FIG. 3 is a cross-sectional view of the speaker unit along line AA in FIG. 1.

Please refer to FIGS. 1-3, the present disclosure provides a speaker unit 100, the speaker unit 100 includes a frame 1, a vibration system 2 and a magnetic circuit system 3 fixed on the frame 1, a magnetic front cover 4 fixed on the frame 1. The magnetic front cover 4 is a soft magnetic front cover (e.g., a pole plate) or a hard magnetic front cover (e.g., a magnet). The magnetic front cover 4 is fixed to the frame 1 by gluing or fixed to the frame 1 by welding.

The vibration system 2 includes a diaphragm 21, a voice coil 22 that drives the diaphragm 21 to vibrate and sound, and an elastic support element 23 that is spaced from the diaphragm 21. The external fixed part 23a of the elastic support element 23 is fixed to the frame 1, and the internal fixed part 23b of the elastic support element 23 is fixed to the voice coil 22 to support the voice coil 22. The magnetic front cover 4 extends at least partially above the diaphragm 21 so as to protect the vibration system 2.

The magnetic circuit system 3 includes a bottom plate 31, a main magnet 32 and an auxiliary magnet 33 fixed on the bottom plate 31 and spaced apart from each other, a main pole plate 34 attached to the main magnet 32 and a auxiliary pole plate 35 attached to the auxiliary magnet 33. The auxiliary pole plate 35 is provided with a first flipped edge 351 bent in a direction close to the bottom plate 31. The first flipped edge 351 is embedded in the frame 1.

The frame 1 includes a first side wall 11 located at four corners and a second side wall 12 located between two adjacent first side walls 11. The bottom plate 31 is provided with a second flipped edge 311 that is bent in a direction close to the diaphragm 21. The second flipped edge 311 is interposed between the adjacent first side wall 11 and the second side wall 12.

The elastic support element 23 includes a flexible circuit board 231 fixed with the voice coil 22 and an auxiliary diaphragm 232 fixed on the bottom surface of the flexible circuit board 231 away from the diaphragm 21. The voice coil 22 is electrically connected to the external power supply through the flexible circuit board 231. The auxiliary diaphragm 232 can adjust the vibration damping of the elastic support element 23.

The bottom plate 31 is provided with a through hole 310 corresponding to the position of the auxiliary diaphragm 232. The through hole 310 may provide vibration space for the auxiliary diaphragm 232. The speaker unit 100 can be connected. The damping net cloth 5 covering the through hole 310 is attached to the bottom surface of the bottom plate 31 away from the auxiliary diaphragm 232. The damping net cloth 5 can prevent foreign matter from entering the interior of the speaker unit 100, and can also adjust the airflow damping at the through hole 310.

The speaker unit of the present disclosure adopts a magnetic front cover, and the magnetic front cover optimizes the distribution of the magnetic field lines of the magnetic circuit system. When the voice coil works, more magnetic field lines can pass through the voice coil, thereby increasing the BL value of the voice coil. The magnetic front cover protects the vibration system with the conventional front cover and at the same time improves the BL value of the voice coil, killing two birds with one stone and easy to implement. In addition, it is generally believed that the front cover is only used to protect the vibration system, the technical means of improving the BL value of the voice coil through the magnetic front cover is not thought or expected by those skilled in the art, and achieves an unexpected effect.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the disclosure to the full extent indicated by the broad general meaning of the terms where the appended claims are expressed.

What is claimed is:

1. A speaker unit including:
   a frame;
   a vibration system fixed with the frame, having a diaphragm and a voice coil for driving the diaphragm for generating sound;
   a magnetic circuit system fixed on the frame;
   a magnetic front cover fixed on the frame for increasing a BL value of the voice coil,
   wherein the magnetic circuit system includes a bottom plate, a main magnet fixed on the bottom plate, an auxiliary magnet fixed on the bottom plate and keeping a distance from the main magnet a main pole plate attached to the main magnet, and an auxiliary pole plate attached to the auxiliary magnet; the auxiliary pole plate includes a first flipped edge that is bent toward the bottom plate and is embedded in the frame.

2. The speaker unit as described in claim 1, wherein the frame includes a first side wall located at four corners and a second side wall located between two adjacent first side walls; the bottom plate includes a second flipped edge that is bent in a direction close to the diaphragm; the second flipped edge is inserted between the first side wall and the second side wall adjacent to the first side wall.

3. The speaker unit as described in claim 2, wherein the vibration system further includes an elastic support element arranged spaced apart from the diaphragm; the external fixed part of the elastic support element is fixed on the frame, and the internal fixed part of the elastic support element is fixed on the voice coil.

4. The speaker unit as described in claim 3, wherein the elastic support element includes a flexible circuit board fixed with the voice coil and an auxiliary diaphragm fixed on a bottom surface of the flexible circuit board away from the diaphragm; the bottom plate includes a through hole corresponding to the position of the auxiliary diaphragm, and a damping net cloth formed at the bottom surface of the bottom plate away from the auxiliary diaphragm for covering the through hole.

5. The speaker unit as described in claim 1, wherein, the magnetic front cover is a soft magnetic front cover or a hard magnetic front cover.

6. The speaker unit as described in claim 1, wherein the magnetic front cover is fixed to the frame by gluing or welding.

7. The speaker unit as described in claim 1, wherein the magnetic front cover extends at least partially above the diaphragm.

* * * * *